United States Patent

Hochheiser et al.

[15] 3,663,895

[45] May 16, 1972

[54] FREE RUNNING L-C OSCILLATOR USING SILICON-CONTROLLED RECTIFIER

[72] Inventors: Jerome S. Hochheiser, Northridge; Louis Zermeno, Los Angeles; Galen Sitler, Duarte, all of Calif.

[73] Assignee: Hochheiser Eectronics Corporation, Burbank, Calif.

[22] Filed: Nov. 12, 1970

[21] Appl. No.: 88,871

[52] U.S. Cl. ..........331/117 R, 331/165

[51] Int. Cl. ..........H03b 5/12, H03b 11/00

[58] Field of Search ..........331/107 R, 111, 113 S, 117 R, 331/128, 165; 307/305

[56] References Cited

UNITED STATES PATENTS

| | | | |
|---|---|---|---|
| 2,502,671 | 4/1950 | Rossnick | 331/128 X |
| 3,229,226 | 1/1966 | Wilting | 331/113.1 S |
| 3,273,077 | 9/1966 | Camenzind | 331/117 X |

OTHER PUBLICATIONS

General Electric Co., " Notes on the Application of the Silicon Controlled Rectifier," December 1958, p. 1. TK2798G4

*Primary Examiner*—Roy Lake

*Assistant Examiner*—Siegfried H.

*Attorney*—Christie, Parker & Hale

[57] ABSTRACT

There is described an oscillator circuit utilizing a tank circuit and a silicon-controlled rectifier connecting a portion of the tank circuit across a DC potential source. The gate electrode of the silicon-controlled rectifier is controlled from a voltage taken off the tank circuit through a delay network to provide the correct phase relationship between the triggering of the silicon-controlled rectifier and the voltage across the tank circuit.

5 Claims, 2 Drawing Figures

INVENTOR.
JEROME S. HOCHHEISER
LOUIS ZERMENO
GALEN SITLER
BY
Christie, Parker, & Hale
ATTORNEYS

FREE RUNNING L-C OSCILLATOR USING SILICON-CONTROLLED RECTIFIER

FIELD OF THE INVENTION

This invention relates to audio oscillators, and more particularly, is concerned with an oscillator utilizing a silicon-controlled rectifier as the amplifying element in the oscillator circuit.

BACKGROUND OF THE INVENTION

The use of transistors in audio oscillator circuits is well known. However, the use of transistors in oscillator circuits presents a problem where an output voltage of several hundred volts peak-to-peak is required combined with fairly high peak current requirements. While such requirements can be met with vacuum tube type circuits, special rather costly transistors are required to get the equivalent performance from a solid state circuit.

SUMMARY OF THE INVENTION

The present invention is directed to an improved oscillator circuit which utilizes a silicon-controlled rectifier as the amplifying element of the circuit. Such a rectifier, which may be referred to as an SCR, has the advantage that it is capable of withstanding rather high back voltages and rather high peak surge currents. Cost of the SCR is substantially less than a transistor having the equivalent reverse voltage and peak current capabilities.

The oscillator circuit comprises a tank circuit including an inductive winding and capacitor. A portion of the winding of the inductor is connected across a DC voltage source through the anode and cathode of an SCR. The gate of the SCR is connected through a phase shift or delay network to a tap on the winding of the tank circuit. By providing the right phase shift of the voltage applied to the gate circuit of the SCR, oscillations are sustained in the tank circuit.

BRIEF DESCRIPTION OF THE DRAWINGS

For a more complete understanding of the invention, reference should be made to the accompanying drawing wherein.

DETAILED DESCRIPTION OF THE INVENTION

Figures 1, 2:
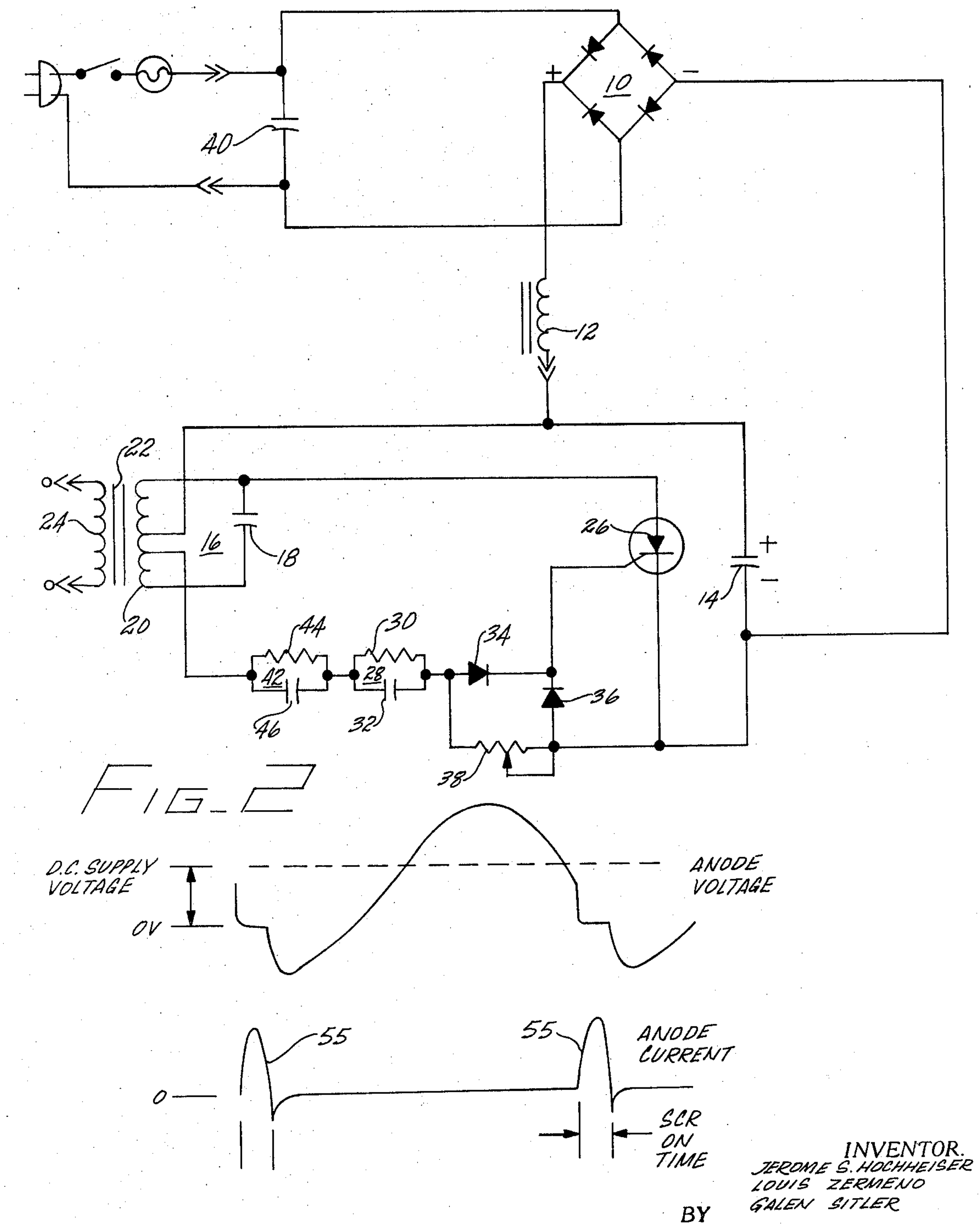
FIG. 1 is a schematic diagram of the circuit of the present invention.
FIG. 2 is a group of wave forms useful in explaining the operation of the invention.

Referring to FIG. 1, the numeral 10 indicates generally a diode bridge-type rectifier with one diagonal of the bridge connected across an alternating current source. DC output is derived across the other diagonal of the bridge and is filtered by a low-pass filter including an inductance 12 and a capacitance 14.

The oscillator circuit includes a tank circuit 16 comprising a capacitor 18 and an inductive winding 20. The inductive winding 20 is preferably arranged as the primary of a step-up transformer 22, an output signal being derived from the oscillator across a secondary winding 24.

The positive side of the DC voltage source is connected to the center tap of the primary winding 20. One end of the winding 20 is connected to the anode of a silicon-controlled (SCR) rectifier 26. The cathode of the SCR in turn is connected to the negative terminal of the DC potential source.

The SCR is controlled through the gate electrode by a feedback network taken from a tap on the winding 20 and connected through a phase-shift network 28 comprising a resistor 30 and a capacitor 32 in parallel. The feedback network preferably includes a series diode 34. Also a diode 36 may clamp the gate to the cathode electrode of the SCR 26. A shunting variable resistor 38 permits some adjustment of the frequency and current drawn by the oscillator.

To prevent the SCR from being triggered on by line transients which might produce positive spikes on the gate electrode of the SCR, a capacitor 40 is connected across the AC diagonal of the rectifier bridge 10. Also an additional phase-shifting network 42, including a resistor 44 and capacitor 46, may be provided in series with the phase-shift network 28. It has been found that the capacitor 40 in combination with the additional phase-shift network 42 effectively prevents any premature firing of the SCR which can cause the circuit to draw excessive current and to blow the fuses on the input to the device.

As shown by the wave forms of FIG. 2, the anode voltage generally follows a sine wave which varies about the DC supply voltage applied to the tank circuit. The phase of the gate voltage derived from the tank circuit is adjusted such that the SCR fires for a fraction of a cycle, the SCR being turned off by the negative swing of the anode voltage. The SCR does not fire again until the gate voltage goes sufficiently positive with relation to the cathode to fire the SCR. This occurs just before the anode swings negative so that the SCR conducts for a very small fraction of a complete cycle of the alternating voltage across the tank circuit. When the power is turned on, the initial surge in charging the capacitor 18 of the tank circuit produces sufficient positive bias on the gate to fire the SCR and start the oscillation. Thus the oscillator is self-starting.

It should be noted that the Q of the tank circuit may be relatively low. A Q of the order of 10 has been found satisfactory. A peak anode current through the SCR of the order of 15 amps presents no problem since the SCR is rated for peak surge currents of the order of 80 amps. The SCR is capable of handling back voltages of over 100 volts. Thus it will be seen that the circuit of the present invention is capable of producing sustained oscillations at relatively large peak voltages, of the order of 200 volts peak-to-peak at a very low cost. By utilizing a step-up transformer, much higher voltages on the output of the secondary winding 24 may be provided.

What is claimed is:

1. An oscillator circuit comprising an L-C tank circuit, a source of d-c power a silicon-controlled rectifier having cathode, anode, and gate electrodes, means connecting the cathode and anode electrodes in series circuit with a portion of the tank circuit across the d-c potential source, a first diode connecting the gate electrode to the cathode electrode of the silicon-controlled rectifier, and a time delay network connecting the gate electrode to the tank circuit.

2. An oscillator circuit comprising an L-C tank circuit including an inductive winding having a pair of intermediate winding taps, a source of d-c power, a silicon-controlled rectifier having cathode, anode, and gate electrodes, the anode electrode being connected to one end of the inductive winding, the power source being connected to one of said pair of taps and to the cathode of the silicon-controlled rectifier, a first diode connecting the gate electrode to the cathode electrode of the silicon-controlled rectifier, and a time-delay network connecting the gate electrode to the other of said pair of taps on the inductive winding.

3. Apparatus as defined in claim 2 wherein the delay network is a resistor and capacitor in parallel.

4. Apparatus as defined in claim 1 further including a second diode in series with and connecting the delay network to the gate electrode, and a variable resistor connecting the delay network to the cathode electrode.

5. Apparatus as defined in claim 3 including a second delay network including a resistor and capacitor in parallel connected in series with the first delay network.

* * * * *